United States Patent [19]
Itoh et al.

[11] Patent Number: 5,260,580
[45] Date of Patent: Nov. 9, 1993

[54] STAGE DEVICE FOR AN EXPOSURE APPARATUS AND SEMICONDUCTOR DEVICE MANUFACTURING METHOD WHICH USES SAID STAGE DEVICE

[75] Inventors: Hirohito Itoh, Machida; Shinji Ohishi, Oyama, both of Japan

[73] Assignee: Canon Kabushiki Kaisha, Tokyo, Japan

[21] Appl. No.: 941,786

[22] Filed: Sep. 8, 1992

[30] Foreign Application Priority Data

Sep. 18, 1991 [JP] Japan ............................ 3-238214

[51] Int. Cl.⁵ ............................................ H01J 37/20
[52] U.S. Cl. ............................ 250/492.2; 250/442.11; 250/453.11; 378/34; 378/208
[58] Field of Search .......... 250/492.2, 442.11, 453.11; 378/34, 208

[56] References Cited

U.S. PATENT DOCUMENTS 4,810,941  3/1989  Ohishi et al. .................. 318/314
4,891,526  1/1990  Reeds ........................ 250/442.11
5,073,912  12/1991  Kobayashi et al. ............... 378/34

FOREIGN PATENT DOCUMENTS 2-100311  4/1990  Japan.

*Primary Examiner*—Jack I. Berman
*Attorney, Agent, or Firm*—Fitzpatrick, Cella, Harper & Scinto

[57] ABSTRACT

A movable stage device, which has a stationary base, a movable stage and a linear motor, further includes a second linear motor which serves as a second driving device for imparting thrust to the movable stage and which is attached to the movable stage through the intermediation of an attachment plate Both ends of a row of second drive coils are supported above the floor by support plates, which are independent of the stationary base and directly support the row of second drive coils above the floor in such a manner as to provide high rigidity, thereby attaining an improvement in speed and accuracy of positioning and avoiding a waste of energy.

15 Claims, 10 Drawing Sheets

STAGE DEVICE FOR AN EXPOSURE APPARATUS AND SEMICONDUCTOR DEVICE MANUFACTURING METHOD WHICH USES SAID STAGE DEVICE

BACKGROUND OF THE INVENTION

1. Field of the Invention

The present invention relates to a movable stage device for use with semiconductor printing apparatuses, machine tools or the like and a driving method for this device. In particular, it relates to a movable stage device requiring high speed and high accuracy in positioning and a driving method for the device.

2. Description of the Related Art

FIG. 13 is a top view of a conventional movable stage device of the above type; FIG. 14 is an enlarged sectional view taken along line E—E of FIG. 13.

This conventional movable stage device includes a stationary base 1 supported by two dampers $6_1$ and $6_2$ which constitute a stationary base supporting means having low rigidity and are adapted to dampen vibrations from a floor (see FIG. 14). Two guide plates $31_1$ and $31_2$ which constitute a guide means are provided at the right and left sides of the stationary base 1 (as seen in FIG. 14). A movable stage 2 is supported by the stationary base 1 and the guide plates $31_1$ and $31_2$ in a non-contact fashion through the intermediation of a plurality of fluid static pressure bearings (FIGS. 13 and 14 show only fluid static pressure bearings $32_{11}$, $32_{12}$, $32_{13}$, $32_{21}$, $32_{22}$ and $32_{23}$), and a linear motor 4 is provided on the stationary base 1 to constitute a driving means for imparting thrust to the movable stage 2 (see FIG. 14).

The linear motor 4 includes a yoke 42 fastened to the back surface of the movable stage 2 (the surface facing the stationary base 1) and having a rectangular hollow section. A group of drive coils 41 are arranged in a row along the stationary base 1 in the direction of movement of the movable stage 2 (i.e., horizontally) and are supported above the stationary base 1 by supports $35_1$ and $35_2$ at the respective ends of the row so that the row of coils extends through the hollow section of the yoke 42. A pair of permanent magnets $43_1$ and $43_2$ are mounted in the hollow section of the yoke 42. The movable stage 2 moves along the guide plates $31_1$ and $31_2$ when thrust is imparted to the stage by the linear motor 4. The distance the movable stage 2 moves is controlled according to positional information regarding the movable stage 2 obtained by a laser distance measurement system consisting of a mirror 52 fixed to the movable stage 2 and a laser distance measuring device 51.

The above-mentioned dampers $6_1$ and $6_2$ are provided between the stationary base 1 and the floor and have low rigidity because of their low resonance frequency so that vibrations from the floor are not transmitted to the stationary base 1. Thus, they serve to dampen any vibrations generated in the stationary base 1.

In this conventional movable stage device, the positioning of the movable stage 2 is effected quickly and with high accuracy by the following driving method. As shown in FIG. 15, for a long-distance movement, as in the case of moving the movable stage 2 from a stop position to a point near a target position, speed control is performed which allows movement at high speed. For accurate positioning of the stage 2 around the target position, position control is performed. To achieve high-speed movement during speed control, the linear motor 4 is used and, at the same time, an arrangement is adopted in which, as shown in FIG. 15, the speed of the stage is rapidly increased when it starts to move from the stop position and rapidly decreased directly before reaching the target position, thereby maintaining the maximum speed as high as possible and for as long a time as possible.

The conventional movable stage device, however, has the following problems:

(1) The reaction generated when imparting thrust to the movable stage 2 is received by the group of drive coils 41 of the linear motor 4 on the stationary base 1, and the rigidity of the dampers $6_1$ and $6_2$ is insufficient to dampen the reaction, so that increasing abrupt acceleration and deceleration of the movable stage at the time of speed control results in a proportionally increasing reaction, thereby causing the stationary base 1 to shake to a large degree. Therefore, at the time of position control, the movable stage 2 is shaken by the vibration of the stationary base 1. Thus, the conventional device does not help shorten the time taken for final positioning; on the contrary, the conventional device takes a relatively long time to effect final positioning.

(2) The vibration of the stationary base 1 causes its posture to change, thereby changing the posture of the movable stage 2. Thus, when applied to a machine tool or the like, the device will cause deterioration in machining precision. When applied to a semiconductor printing device, the device will cause deterioration in resolution since the focal point of the printing light will be shifted due to the tilting of the stage.

(3) Once the stationary base 1 has begun to shake, there is no means for effectively stopping its vibration; there is nothing to do but to wait for the vibration to subside by itself and cease to have any influence on the operation being performed.

(4) Effecting rapid acceleration and deceleration by using a large-thrust linear motor 4 results in an increase in the quantity of heat generated in the linear motor, thereby causing the movable stage 2, etc. to be deformed by heat. Therefore, when this device is applied to a machine tool or the like, the deformation by heat of the movable stage 2 causes the distance between the mirror 52 and the machining point to change, resulting in deterioration in machining precision. In the case when it is applied to a semiconductor printing apparatus, this device will cause deterioration in printing accuracy because of the changes caused in the distance between the mirror 52 and the printing position.

(5) The consumption of the thrust of the linear motor 4 in shaking the stationary base 1 leads to a waste of energy. These problems and others are addressed and overcome by the present invention.

SUMMARY OF THE INVENTION

It is an object of the present invention to provide a movable stage device and a driving method for it which make it possible to attain an improvement in the speed and accuracy of positioning and which involve no waste of energy.

Another object of the present invention is to provide a high-precision exposure apparatus using the above movable stage device.

Still another object of the present invention is to provide a method of manufacturing highly integrated semiconductor devices by using the above exposure apparatus.

According to a first aspect of the present invention, a stage device is provided which has a stationary base supported by a first support means. A guide means is provided on the stationary base, and a movable stage is supported by the stationary base and the guide means. A first driving means is provided on the stationary base and imparts thrust to the movable stage. The second driving means is supported by second support means, which is independent of the stationary base.

According to another aspect of the present invention, an exposure apparatus including a stage device is provided which has a radiation source for generating radiation for exposure. An optical means is provided for irradiating a mask with radiation from the radiation source in order to transfer a mask pattern onto an object to be exposed. The exposure apparatus also includes a stage device for adjusting a relative positional relationship between the mask and the object to be exposed. The stage device includes a stationary base supported by first support means. A guide means is provided on the stationary base, and a movable stage is supported by the stationary base and the guide means. A first driving means is provided on the stationary base to impart thrust to the movable stage, and a second driving means is provided separate from the first driving means which also imparts thrust to the movable stage. The second driving means is supported by the second support means, which is independent of the stationary base.

According to a further aspect of the present invention, a stage device is provided for use in a semiconductor device manufacturing method which includes the steps of adjusting a relative positional relationship between a mask having a circuit pattern and a wafer by means of the stage device and irradiating the mask with radiation to transfer the circuit pattern onto the wafer. The stage device includes a stationary base supported by first support means. A guide means is provided on the stationary base, and a movable stage is supported by the stationary base and the guide means. A first driving means is provided on the stationary base to impart thrust to the movable stage, and a second driving means, which also imparts thrust to the movable stage, is provided separate from the driving means. The second driving means is supported by second support means, which is independent of the stationary base.

According to yet another aspect of the present invention, a semiconductor device is provided which is manufactured by a manufacturing method that includes the steps of adjusting a relative positional relationship between a mask having a circuit pattern and a wafer by means of a movable stage and irradiating the mask with radiation to transfer the circuit pattern onto the wafer. The adjusting step includes the steps of supporting a stationary base with a first support means, providing guide means on the stationary base and supporting the movable stage with the stationary base and the guide means. The steps further include driving the movable stage with a first driving means provided on the stationary base, driving the movable stage with a second driving means, which is separate from the first driving means and supporting the second driving means with second support means which is independent of the stationary base.

According to still a further aspect of the present invention, a semiconductor device manufacturing method is provided that includes the steps of adjusting a relative positional relationship between a mask having a circuit pattern and a wafer by means of a movable stage and irradiating the mask with radiation to transfer the circuit pattern onto the wafer. The method includes the steps of supporting a stationary base with a first support means, providing guide means on the stationary base and supporting the movable stage with the stationary base and the guide means. The method further includes driving the movable stage with a first driving means provided on the stationary base, driving the movable stage with a second driving means, which is separate from the first driving means and supporting the second driving means with second support means, which is independent of the stationary base.

Further objects of the present invention will become apparent from the description of the preferred embodiments which is to follow.

DESCRIPTION OF THE PREFERRED EMBODIMENTS

Preferred embodiments of the present invention will now be described with reference to the drawings.

FIRST EMBODIMENT

Figure 1:
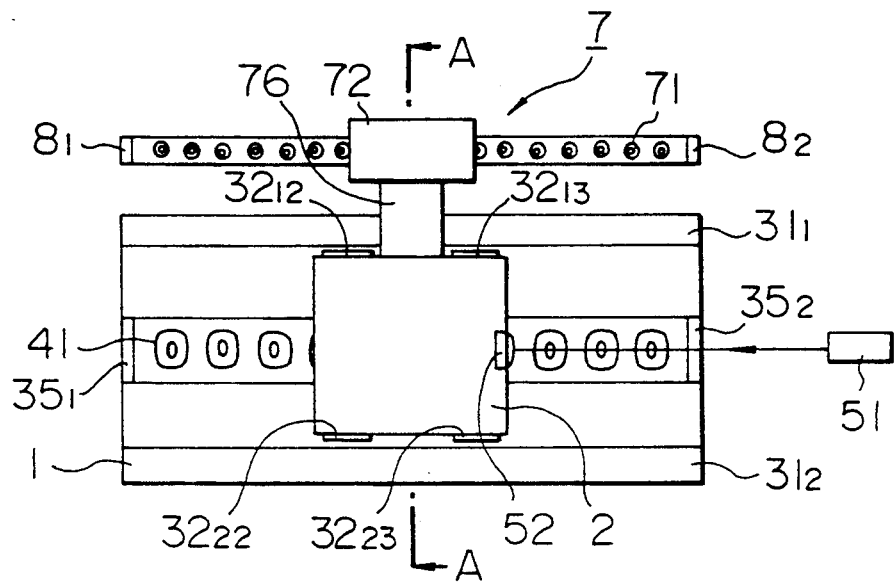
FIG. 1 is a top view of a first embodiment of the movable stage device of the present invention.
Figure 2:
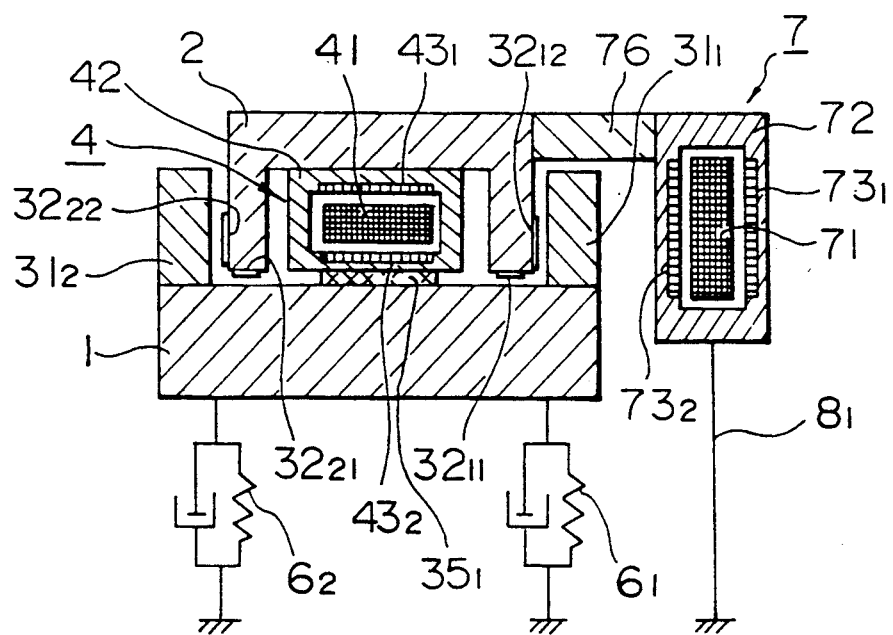
FIG. 2 is an enlarged sectional view taken along line A—A of FIG. 1.

FIG. 1 is a top view of the first embodiment of the movable stage device of the present invention; and FIG. 2 is an enlarged sectional view taken along line A—A of FIG. 1.

Figure 13:
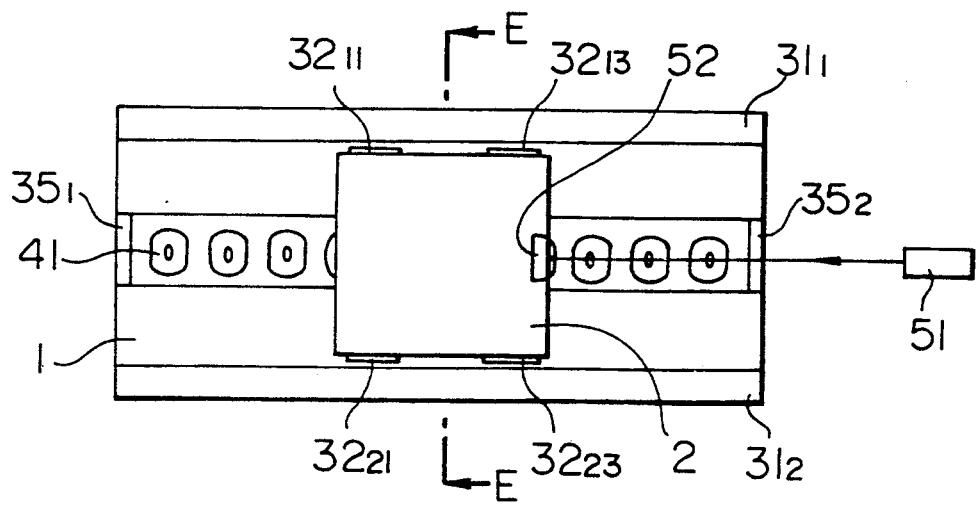
FIG. 13 is a top view of a conventional movable stage device.
Figure 14:
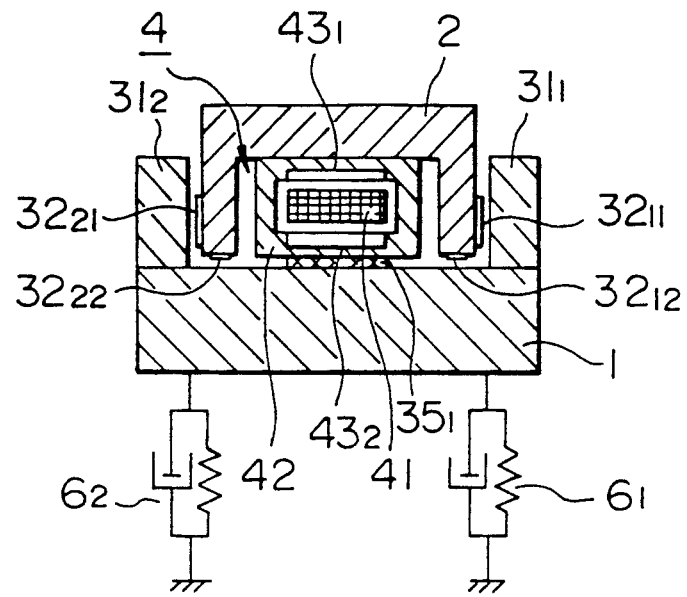
FIG. 14 is an enlarged sectional view taken along line E—E of FIG. 13.

This device differs from the conventional movable stage device shown in FIG. 13 in the following ways:

(1) As shown in FIG. 2, a second linear motor 7 serving as a second driving means for imparting thrust to the movable stage 2 is attached to the right side of the movable stage 2 through the intermediation of an attachment plate 76. The second linear motor 7 includes a second yoke 72, the left-hand side of which is attached to the attachment plate 76, and which has a rectangular hollow section. A second group of drive coils 71 is arranged in a row along the direction that the movable stage 2 moves (i.e., horizontally) and extends through the hollow section of the second yoke 72, and a pair of permanent magnets $73_1$ and $73_2$ is mounted in the hollow section of the yoke 72 with the second row of drive coils 71 therebetween.

(2) The right and left end portions of the second row of drive coils 71 are supported above the floor by support plates $8_1$ and $8_2$, respectively (as seen in FIG. 1). The support plates $8_1$ and $8_2$ are independent of the stationary base 1 and directly support the second row of drive coils 71 above the floor in such a way as to provide high rigidity.

In this movable stage device, the linear motor 4 and the second linear motor 7 are driven in accordance with positional information regarding the movable stage 2 obtained by a laser distance measurement system consisting of a laser distance measuring device 51 and a mirror 52. Since the drive coils 41 and the yoke 42 are not in contact with each other, it is possible to switch between transmission and non-transmission of force by providing a means for turning on/off an electric circuit for supplying electric current to the drive coils 41. This also applies to the second linear motor 7.

Figure 3:
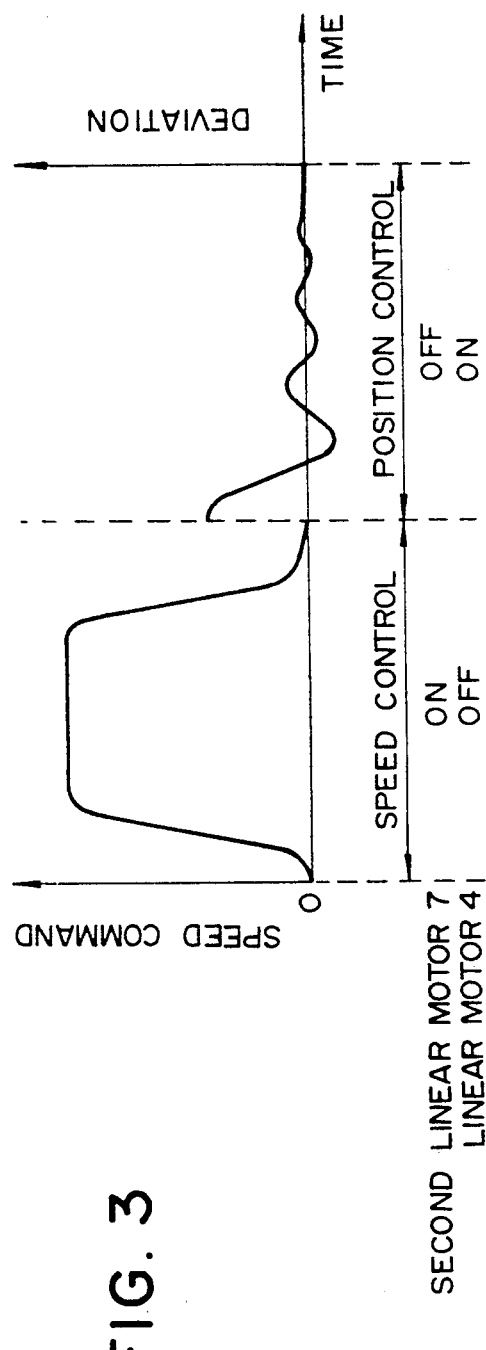
FIG. 3 is a diagram illustrating a first embodiment of the movable stage device driving method of the present invention as applied to the movable stage device shown in FIG. 1.

FIG. 3 illustrates the first embodiment of the movable stage device driving method of the present invention as applied to the movable stage device shown in FIG. 1.

Figure 15:
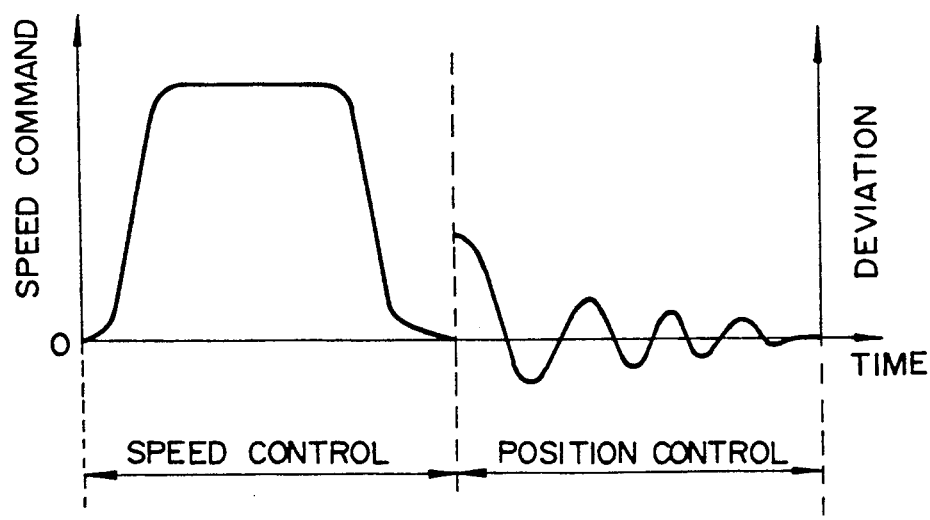
FIG. 15 is a diagram illustrating a method of driving the movable stage device shown in FIG. 13.

This movable stage device driving method is the same as the conventional one which was described above with reference to FIG. 15 in that accurate positioning near the target position is performed by position control after long-distance movement of the stage from the stop position to a point near the target position is performed by speed control, which allows high-speed movement The method of this embodiment, however, differs from the conventional method in the following ways:

(1) Only the second linear motor 7 is used for speed control, which requires a large thrust; and (2) Only linear motor 4 is used for position control, which requires no large thrust.

That is, when moving the movable stage 2 by speed control, which requires a large thrust, only the second linear motor 7 is used, and the linear motor 4 is not used. The movable stage 2 is moved to the proximity of the target position in accordance with a predetermined speed command curve, which is shown on the left-hand side of FIG. 3. At this time, the movable stage 2 is supported by, but without contact with, the stationary base 1 through the intermediation of a plurality of fluid static pressure bearings $32_{11}$, $32_{21}$, etc. and, at the same time, is supported by, but without contact with, guide plates $31_1$ and $31_2$ through the intermediation of four fluid static pressure bearings $32_{12}$, $32_{13}$, $32_{22}$ and $32_{23}$ shown in FIG. 1, so that there is practically no frictional force or the like between the movable stage 2 and the stationary base 1. Further, since the group of drive coils 41 and the yoke 42 of the linear motor 4 also do not have contact with each other, practically no force is transmitted through the linear motor 4 between the movable stage 2 and the stationary base 1 unless the linear motor 4 is used. Thus, when the movable stage 2 is driven by using the second linear motor 7, which is separately provided from the stationary base 1, the stationary base 1 is mechanically isolated, so that no vibration is caused by the effect of rapid acceleration and deceleration, as in the conventional driving method. Further, since the row of second drive coils 71 of the second linear motor 7 is rigidly supported by the support plates $8_1$ and $8_2$, the vibration caused by the effect of rapid acceleration and deceleration is small, so that there is little waste of energy.

When the movable stage 2 has substantially come to a stop after moving to the proximity of the target position, the second linear motor 7 is stopped in order to terminate the speed control At this time, the second drive coils 71 slightly vibrate due to the reaction caused by the acceleration and deceleration in the speed control and, at the same time, vibrations from the floor are transmitted due to the high rigidity of the support plates $8_1$ and $8_2$. However, since the row of drive coils 71 of the second linear motor 7 is mechanically separated from the second yoke 72, the vibration of the second drive coils 71 does not affect the stationary base 1 and the movable stage 2 in the subsequent positioning operation. Further, by effecting position control by using the linear motor 4 on the stationary base 1, it is possible to perform positioning quickly and with high accuracy without being affected by the vibration due to the acceleration and deceleration as in the conventional method. The acceleration and deceleration of the stage during positioning is much smaller than during its movement in speed control, so that the positioning operation is hardly influenced by the effect of the acceleration and deceleration during positioning.

From the above discussion, it may be concluded that the method of this embodiment has at least the following advantages:

(1) Since substantially no vibration is generated in the stationary base 1, there is no deterioration in machining precision or printing accuracy due to changes in the posture of the stationary base 1 as in the conventional driving method.

(2) Since rapid acceleration and deceleration requiring a large thrust are effected by using the second linear motor 7 provided outside the stationary base 1, the linear motor 4, provided on the stationary base 1 and used for positioning, requires no large thrust. As a result, the quantity of heat generated in the linear motor 4 is much smaller as compared with the conventional driving method. Further, since the second linear motor 7, which generates a large quantity of heat, is supported apart from the stationary base 1 and the movable stage 2, deterioration in machining precision or printing accuracy due to thermal deformation can be avoided.

(3) Any vibration caused for some reason or other in the stationary base 1 can be stopped by using the linear motor 4 and the second linear motor 7 simultaneously. In that case, the support plates $8_1$ and $8_2$ serve as a reference. The device can be driven in such a case by simultaneously effecting servo lock in the linear motor 4 and the second linear motor 7 to lock the movable stage 2 with respect to the support plates $8_1$ and $8_2$, or by locking one linear motor by servo lock and effecting damping control on the other linear motor.

SECOND EMBODIMENT

Figure 4:
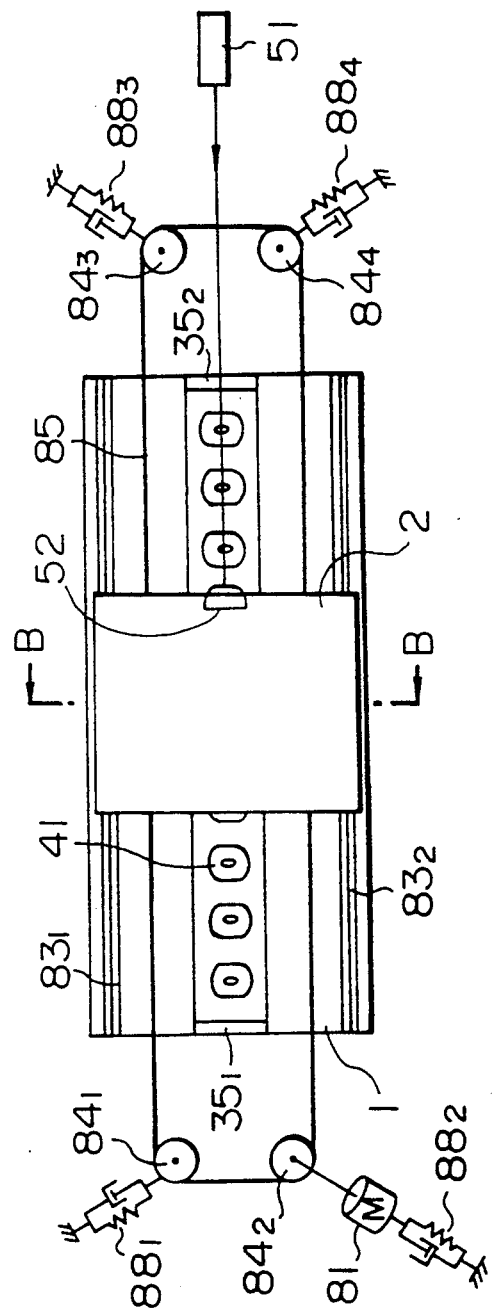
FIG. 4 is a top view of a second embodiment of the movable stage device of the present invention.
Figure 5:
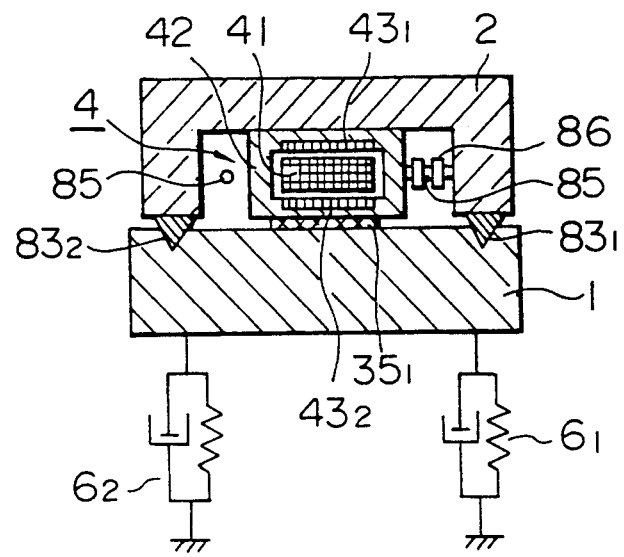
FIG. 5 is an enlarged sectional view taken along line B—B of FIG. 4.

FIG. 4 is a top view showing the second embodiment of the movable stage device of the present invention; and FIG. 5 is an enlarged sectional view taken along line B—B of FIG. 4.

The movable stage device of this embodiment differs from the one shown in FIG. 1 in the following ways:

(1) Instead of the guide plates $31_1$ and $31_2$ of the first embodiment, two slide guide grooves $83_1$ and $83_2$ are provided as guide means, which are arranged near the right and left edges of the stationary base 1 (as seen in FIG. 5).

(2) Instead of the second linear motor 7 of the first embodiment, there are provided, as the second driving means, pulleys $84_1$ and $84_2$ arranged on the left-hand side (as seen in FIG. 4), pulleys $84_3$ and $84_4$ arranged on the right-hand side (as seen in FIG. 4), a wire 85 stretched between the pulleys $84_1 \sim 84_4$, and a motor 81 for rotating the pulley $84_2$ in the lower left corner (as seen in FIG. 4). As shown in FIG. 5, the wire 85 runs through two spaces defined between the inner side walls of the movable stage 2, which has a U-shaped cross section, and the side walls of the yoke 42. By pinching the wire 85 with a clamper 86 provided between an inner side wall of the movable stage 2 and a side wall of the yoke 42, it is possible to transmit thrust to the movable stage 2.

(3) Instead of the support plates $8_1$ and $8_2$ of the first embodiment, four support dampers $88_1$ through $88_4$ are provided. The pulleys except for the one in the lower left corner in FIG. 4, i.e., the pulleys $84_1$, $84_3$ and $84_4$, and the motor 81 are supported above the floor by the support dampers $88_1$ through $88_4$. The support dampers $88_1 \sim 88_4$ have high rigidity with respect to the reaction to driving the movable stage and are set upright with respect to the floor surface so that no vibration is transmitted from the floor in other directions.

This movable stage device is driven in the following manner:

(1) For speed control, which requires a large thrust, only the motor 81 is used; and (2) For position control, which requires no large thrust, only the linear motor 4 is used.

That is, when the movable stage 2 is moved by speed control, which requires a large thrust, only the motor 81 is used, not the linear motor 4, the movable stage 2 being moved up to the proximity of the target position in accordance with a predetermined speed command curve. The movable stage 2 is supported by the stationary base 1 through the intermediation of the slide guide grooves $83_1$ and $83_2$, which involve very small friction in the sliding directions, so that the reaction force and vibration due to the acceleration and deceleration of the movable stage 2 are barely transmitted to the stationary base 1. After that, the clamper 86 is released to separate the wire 85 from the movable stage 2, thereby preventing the vibration of the wire 85, the pulleys $84_1 \sim 84_4$ and the motor 81 caused by the acceleration and deceleration from being transmitted to the movable stage 2 and the stationary base 1. In the subsequent positioning operation, the linear motor 4 provided on the stationary base 1 is used as in the case of the movable stage device shown in FIG. 1, thereby performing positioning quickly and accurately without causing the stationary base 1 to vibrate.

When the stationary base 1 has started to vibrate for some reason or other, the motor 81 and the linear motor 4 are used simultaneously, with the wire 85 pinched by the clamper 86, thereby effectively stopping the vibration of the stationary base 1.

THIRD EMBODIMENT

Figure 6:
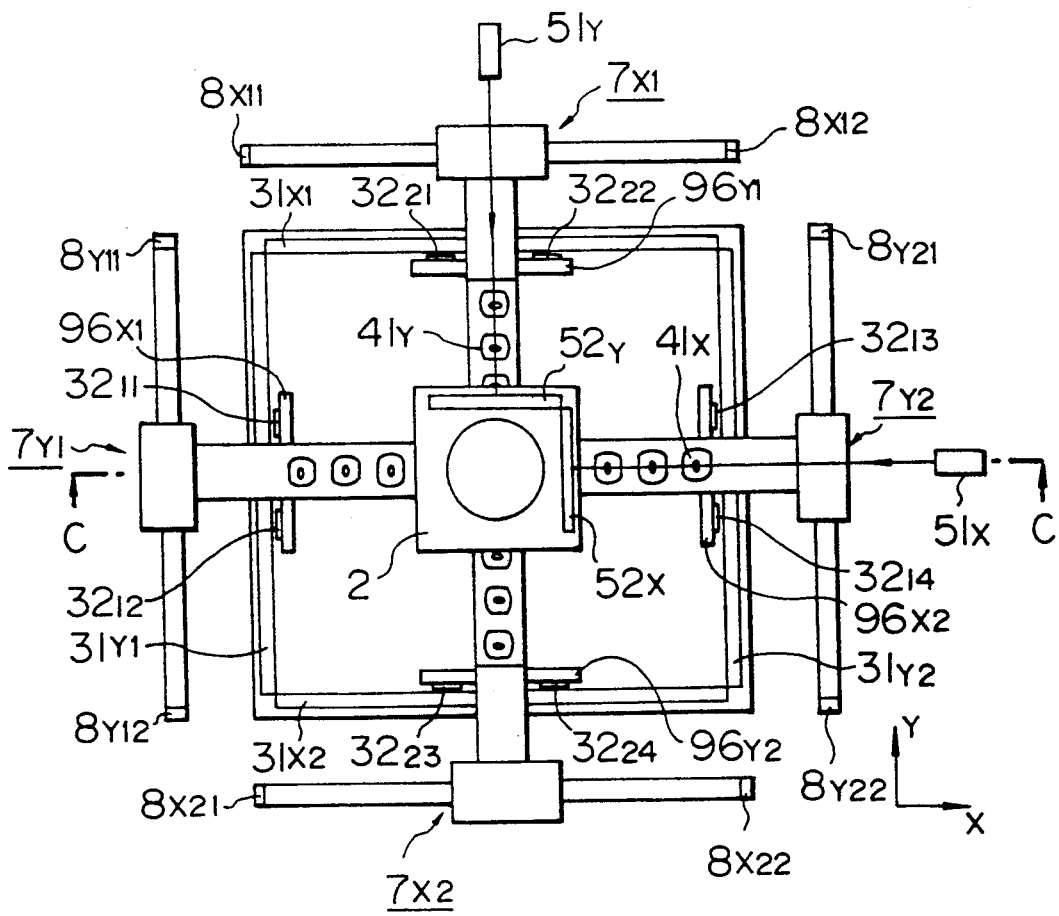
FIG. 6 is a top view of a third embodiment of the movable stage device of the present invention.
Figure 7:
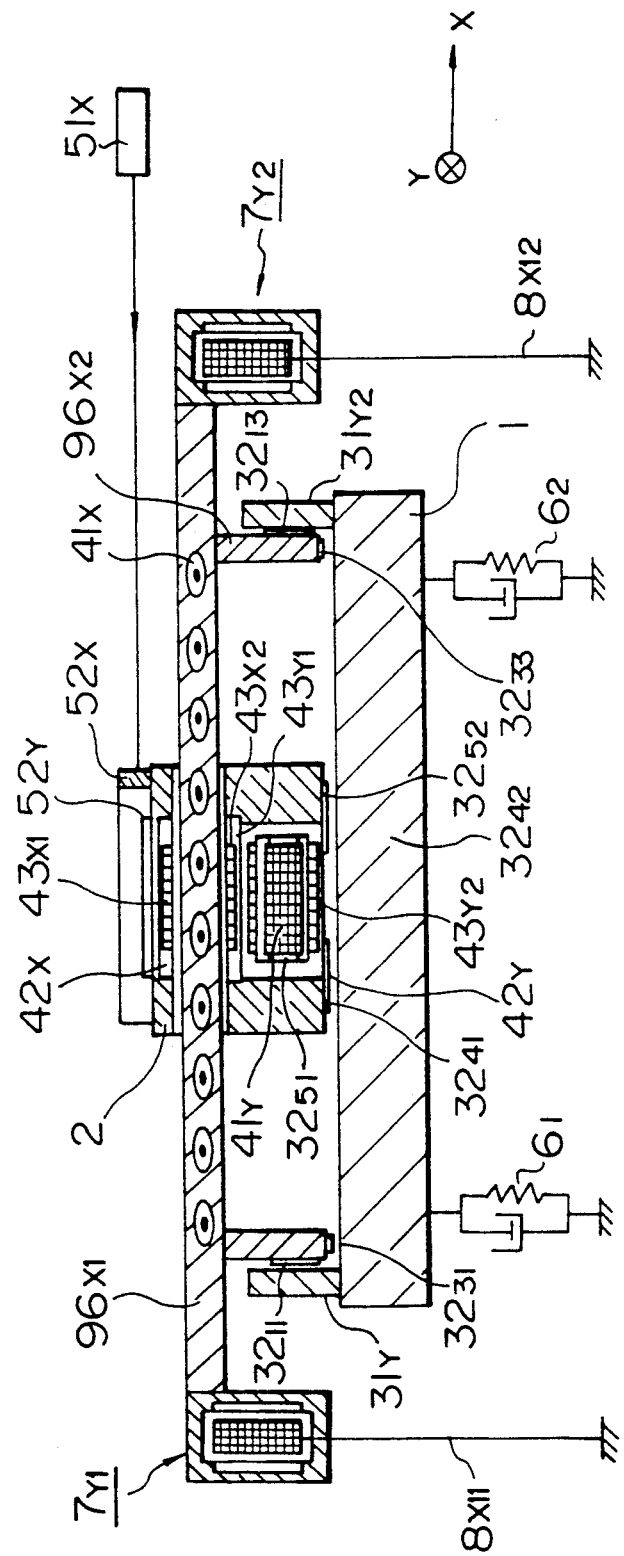
FIG. 7 is an enlarged sectional view taken along line C—C of FIG. 6.

FIG. 6 is a top view of the third embodiment of the movable stage device of the present invention; and FIG. 7 is an enlarged sectional view taken along line C—C of FIG. 6.

In the movable stage device of this embodiment, the movable stage 2 of the movable stage device of the first embodiment, shown in FIG. 1, can freely move in the XY plane shown in FIG. 6 (a so-called XY stage). That is, in the movable stage device of the third embodiment, the movable stage 2 is moved in the X-axis direction by an X-axis direction linear motor $4_X$ (not shown) and a pair of second X-axis direction linear motors $7_{X1}$ and $7_{X2}$, and in the Y-axis direction by a Y-axis direction linear motor $4_Y$ (not shown) and a pair of second Y-axis direction linear motors $7_{Y1}$ and $7_{Y2}$.

As shown in FIG. 7, provided inside the movable stage 2 are upper and lower yokes (an X-axis direction yoke $42_X$ and a Y-axis direction yoke $42_Y$) having hollow sections intersecting each other. The upper yoke, i.e., the X-axis direction yoke $42_X$, functions as the yoke of the X-axis direction linear motor $4_X$, and the lower yoke, i.e., the Y-axis direction yoke $42_Y$, functions as the yoke of the Y-axis direction linear motor $4_Y$. Thus, the X-axis direction linear motor $4_X$ consists of the X-axis direction yoke $42_X$, a row of X-axis direction drive coils $41_X$ fixed in position in a row in the X-axis direction and extending through the hollow section of the X-axis direction yoke $42_X$, and a pair of X-axis direction permanent magnets $43_{X1}$ and $43_{X2}$ attached to the X-axis direction yoke $42_X$ in such a way as to be opposed to each other with the row of X-axis direction drive coils $41_X$ therebetween.

As shown in FIG. 6, provided at the ends in the X-axis direction of the row of X-axis direction drive coils $41_X$ are legs $96_{X1}$ and $96_{X2}$, which are supported by the stationary base 1 and a pair of parallel Y-axis direction guide plates $31_{Y1}$ and $31_{Y2}$ fixed to the end portions in the X-axis direction of the stationary base 1 through the intermediation of fluid static pressure bearings as described below. That is, two fluid static pressure bearings $32_{11}$ and $32_{12}$ are provided between the leg $96_{X1}$ on the left-hand side of FIG. 6 and the Y-axis direction guide plate $31_{Y1}$, and two fluid static pressure bearings $32_{13}$ and $32_{14}$ are provided between the leg $96_{X2}$ on the right-hand side of FIG. 6 and the Y-axis direction guide plate $31_{Y2}$. Further, as shown in FIG. 7, two fluid static pressure bearings $32_{31}$ and $32_{32}$ (the latter of which is not shown) are provided between the leg $96_{X1}$ on the left-hand side of FIG. 6 and the stationary base 1, and two fluid static pressure bearings $32_{33}$ and $32_{34}$ (the latter of which is not shown) are provided between the leg $96_{X2}$ on the right-hand side of FIG. 6 and the stationary base 1. Further, though not shown in the drawing, there are provided two fluid static bearings respectively in the right and left gaps between the row of X-axis direction drive coils 41 and the X-axis direction yoke $42_X$.

The Y-axis direction linear motor $4_Y$ consists of the Y-axis direction yoke $42_Y$, a row of Y-axis direction drive coils $41_Y$ arranged in a row in the Y-axis direction and extending through the hollow section of the Y-axis direction yoke $42_Y$, and a pair of Y-axis direction permanent magnets $43_{Y1}$ and $43_{Y2}$ attached to the Y-axis direction yoke $42_Y$ in such a way as to be opposed to each other with the row of Y-axis direction drive coils $41_Y$ therebetween. As shown in FIG. 6, provided at the ends in the Y-axis direction of the row of Y-axis direction drive coils $41_Y$ are legs $96_{Y1}$ and $96_{Y2}$, which are supported by the stationary base 1 and a pair of parallel X-axis direction guide plates $31_{X1}$ and $31_{X2}$ fixed to the end portions in the Y-axis direction of the stationary base 1 through the intermediation of fluid static pressure bearings as described below. That is, two fluid static pressure bearings $32_{21}$ and $32_{22}$ are provided between the leg $96_{Y1}$ on the top side of FIG. 6 and the X-axis direction guide plate $31_{X1}$, and two fluid static pressure bearings $32_{23}$ and $32_{24}$ are provided between the leg $96_{Y2}$ on the bottom side of FIG. 6 and the X-axis direction guide plate $31_{X2}$. Further, though not shown in the drawing, two fluid static pressure bearings are provided between the leg $96_{Y1}$ on the top side of FIG. 6 and the stationary base 1, and two fluid static pressure bearings are provided between the leg $96_{Y2}$ on the bottom side of FIG. 6 and the stationary base 1 Further, two fluid static bearings $32_{51}$ and $32_{52}$ are provided respectively in the right and left gaps between the row of Y-axis direction drive coils $41_Y$ and the Y-axis direction yoke $42_Y$ (as seen in FIG. 7).

Each of the second X-axis direction linear motors $7_{X1}$ and $7_{X2}$ has a construction similar to that of the second linear motor 7 of the first embodiment shown in FIG. 1, and their respective yokes are attached to the ends of the row of Y-axis direction drive coils $41_Y$. The left-hand end portion of the upper second X-axis direction linear motor $7_{X1}$ in FIG. 6 is supported by a support plate $8_{X11}$, and the right-hand end portion of the same is supported by a support plate $8_{X12}$. Further, the left-hand end portion of the lower second X-axis direction linear motor $7_{X2}$ in FIG. 6 is supported by a support plate $8_{X21}$, and the right-hand end portion of the same is supported by a support plate $8_{X22}$.

Each of the second Y-axis direction linear motors $7_{Y1}$ and $7_{Y2}$ has a construction similar to that of the second linear motor 7 of the first embodiment shown in FIG. 1, and their respective yokes are attached to the ends of the row of X-axis direction drive coils $41_X$. The left-hand end portion of the upper second Y-axis direction linear motor $7_{Y1}$ in FIG. 6 is supported by a support plate $8_{Y11}$, and the lower end portion of the same is supported by a support plate $8_{Y12}$. Further, the top end portion of the right-hand second Y-axis direction linear motor $7_{Y2}$ in FIG. 6 is supported by a support plate $8_{Y21}$, and the lower end portion of the same is supported by a support plate $8_{Y22}$.

This movable stage device is driven in the following manner:

(1) For speed control, which requires a large thrust, the pair of second X-axis direction linear motors $7_{X1}$ and $7_{X2}$ and the pair of second Y-axis direction linear motors $7_{Y1}$ and $7_{Y2}$ are used; and (2) For position control, which requires no large thrust, the X-axis direction linear motor $4_X$ and the Y-axis direction linear motor $4_Y$ are used.

That is, when the movable stage 2 is moved by speed control, which requires a large thrust, the X-axis direction linear motor $4_X$ and the Y-axis direction linear motor $4_Y$ are not used; instead, the pair of second X-axis direction linear motors $7_{X1}$ and $7_{X2}$ and the pair of second Y-axis direction linear motors $7_{Y1}$ and $7_{Y2}$ are used, the movable stage 2 being moved up to the proximity of the target position in accordance with a predetermined speed command curve. In the positioning subsequent to that, the X-axis direction linear motor $4_X$ and the Y-axis direction linear motor $4_Y$ are used, thereby performing positioning quickly and accurately without causing the stationary base 1 to vibrate.

When the stationary base 1 has started to vibrate for some reason or other, the X-axis direction linear motor $4_X$, the Y-axis direction linear motor $4_Y$, the pair of second X-axis direction linear motors $7_{X1}$ and $7_{X2}$, and the pair of second Y-axis direction linear motors $7_{Y1}$ and $7_{Y2}$ are used simultaneously, thereby stopping the vibration of the stationary base 1.

In this movable stage device, the X-axis direction linear motor $4_X$ and the pair of second X-axis direction linear motors $7_{X1}$ and $7_{X2}$ are driven in accordance with information on the position in the X-axis direction of the movable stage 2 as obtained by an X-axis direction laser distance measuring device $51_X$ and an X-axis direction mirror $52_X$. The Y-axis direction linear motor $4_Y$ and the pair of second Y-axis direction linear motors $7_{Y1}$ and $7_{Y2}$ are driven in accordance with information on the position in the Y-axis direction of the movable stage 2 as obtained by a Y-axis direction laser distance measuring device $51_Y$ and a Y-axis direction mirror $52_Y$.

FOURTH EMBODIMENT

Figure 8:
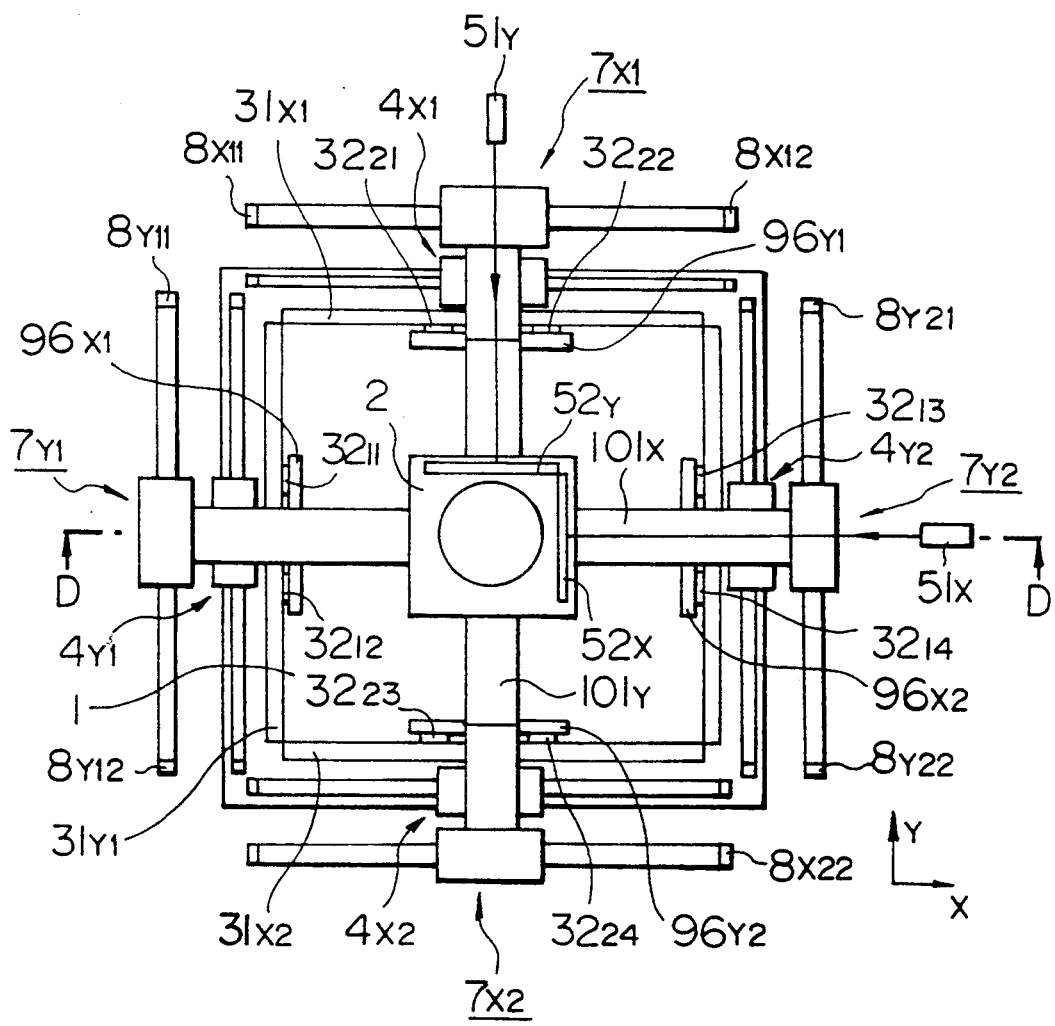
FIG. 8 is a top view of a fourth embodiment of the movable stage device of the present invention.
Figure 9:
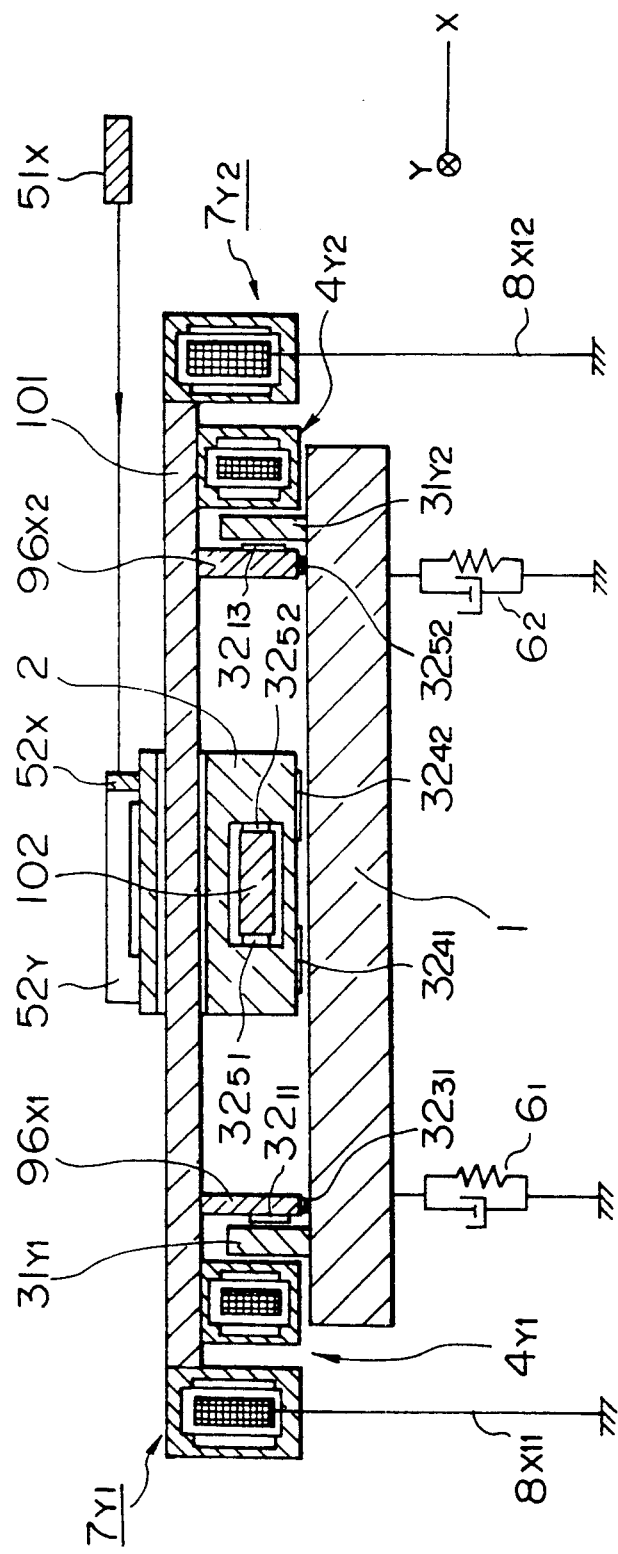
FIG. 9 is an enlarged sectional view taken along line D—D of FIG. 8.

FIG. 8 is a top view of the fourth embodiment of the movable stage device of the present invention; and FIG. 9 is an enlarged sectional view taken along line D—D of FIG. 8.

The movable stage device of this embodiment differs from the one shown in FIG. 6 in the following ways:

(1) Instead of the X-axis direction drive coils $41_X$ and the Y-axis direction drive coils $41_Y$ shown in FIG. 6, an X-axis direction beam $101_X$ and a Y-axis direction beam $101_Y$ are provided.

(2) As shown in FIG. 8, the stage device of this embodiment includes a pair of X-axis direction linear motors $4_{X1}$ and $4_{X1}$ respectively attached to the upper and lower ends of the Y-axis direction beam $101_Y$ and a pair of Y-axis direction linear motors $4_{Y1}$ and $4_{Y2}$ respectively attached to the right and left ends of the X axis direction beam $101_X$. Though not shown in detail in FIG. 8, the X-axis direction linear motors $4_{X1}$ and $4_{X2}$ are supported by the stationary support 1 through the intermediation of support plates provided between the stationary support 1 and the right and left ends of the X-axis direction linear motors $4_{X1}$ and $4_{X2}$. This is the same with the Y-axis direction linear motors $4_{Y1}$ and $4_{Y2}$.

This movable stage device is driven in the following manner:

(1) For speed control, which requires a large thrust, the pair of second X-axis direction linear motors $7_{X1}$ and $7_{X2}$ and the pair of second Y-axis direction linear motors $7_{Y1}$ and $7_{Y2}$ are used; and (2) For position control, which requires no large thrust, the pair of X-axis direction linear motors $4_{X1}$ and $4_{X2}$ and the pair of Y-axis direction linear motors $4_{Y1}$ and $4_{Y2}$ are used.

That is, when the movable stage 2 is moved by speed control, which requires a large thrust, the pair of X-axis direction linear motors $4_{X1}$ and $4_{X2}$ and the pair of Y-axis direction linear motors $4_{Y1}$ and $4_{Y2}$ are not used; instead, the pair of second X-axis direction linear motors $7_{X1}$ and $7_{X2}$ and the pair of second Y-axis direction linear motors $7_{Y1}$ and $7_{Y2}$ are used, the movable stage 2 being moved up to the proximity of the target position in accordance with a predetermined speed command curve. In the positioning subsequent to that, the pair of X-axis direction linear motors $4_{X1}$ and $4_{X2}$ and the pair of Y-axis direction linear motors $4_{Y1}$ and $4_{Y2}$ are used, thereby performing positioning quickly and accurately without causing the stationary base 1 to vibrate.

When the stationary base 1 has started to vibrate for some reason or other, the pair of X-axis direction linear motors $4_{X1}$ and $4_{X1}$ and the pair of Y-axis direction linear motors $4_{Y1}$ and $4_{Y2}$ and the pair of second X-axis direction linear motors $7_{X1}$ and $7_{X2}$, and the pair of second Y-axis direction linear motors $7_{Y1}$ and $7_{Y2}$ are used simultaneously, thereby stopping the vibration of the stationary base 1.

In this movable stage device, the pair of X-axis direction linear motors $4_{X1}$ and $4_{X2}$ and the pair of second X-axis direction linear motors $7_{X1}$ and $7_{X2}$ are driven in accordance with information regarding the position in the X-axis direction of the movable stage 2 as obtained by an X-axis direction laser distance measuring device $51_X$ and an X-axis direction mirror $52_X$. The pair of Y-axis direction linear motors $4_{Y1}$ and $4_{Y2}$ and the pair of second Y-axis direction linear motors $7_{Y1}$ and $7_{Y2}$ are driven in accordance with information regarding the position in the Y-axis direction of the movable stage 2 as obtained by a Y-axis direction laser distance measuring device $51_Y$ and a Y-axis direction mirror $52_Y$.

While in the above description the movable stage moves in a plane parallel to the floor, it is also possible for the movable stage to move in a plane perpendicular to the floor as in the case of an X ray exposure apparatus using a synchrotron radiation as the light source (Japanese Patent Application Laid-Open No. 2-100311).

Due to the second driving means which is supported by a support means separately provided from the stationary base and which serves to impart thrust to the movable stage, the above-described movable stage device is capable of performing speed control, which requires a large thrust, by using the above second driving means, so that any reaction due to rapid acceleration and deceleration can be received by the above support means, thereby achieving an improvement in speed and accuracy of positioning. Further, by imparting high rigidity to this support means, which receives the reaction caused by the large thrust, the support means practically makes no vibration, thereby avoiding a waste of energy.

Further, in the movable stage device driving method described above, a control operation which requires a large thrust is effected by using only the second driving means to impart thrust to the movable stage, and a control operation which requires no large thrust is effected by using only the driving means which is provided on the stationary base, so that any reaction caused by rapid acceleration and deceleration of the movable stage can be received by the support means for supporting the second driving means, thereby attaining an improvement in speed and accuracy of positioning. Further, any vibration of the movable stage can be effectively stopped by imparting thrust to the movable stage by using both the above driving means and the second driving means.

Figure 10:
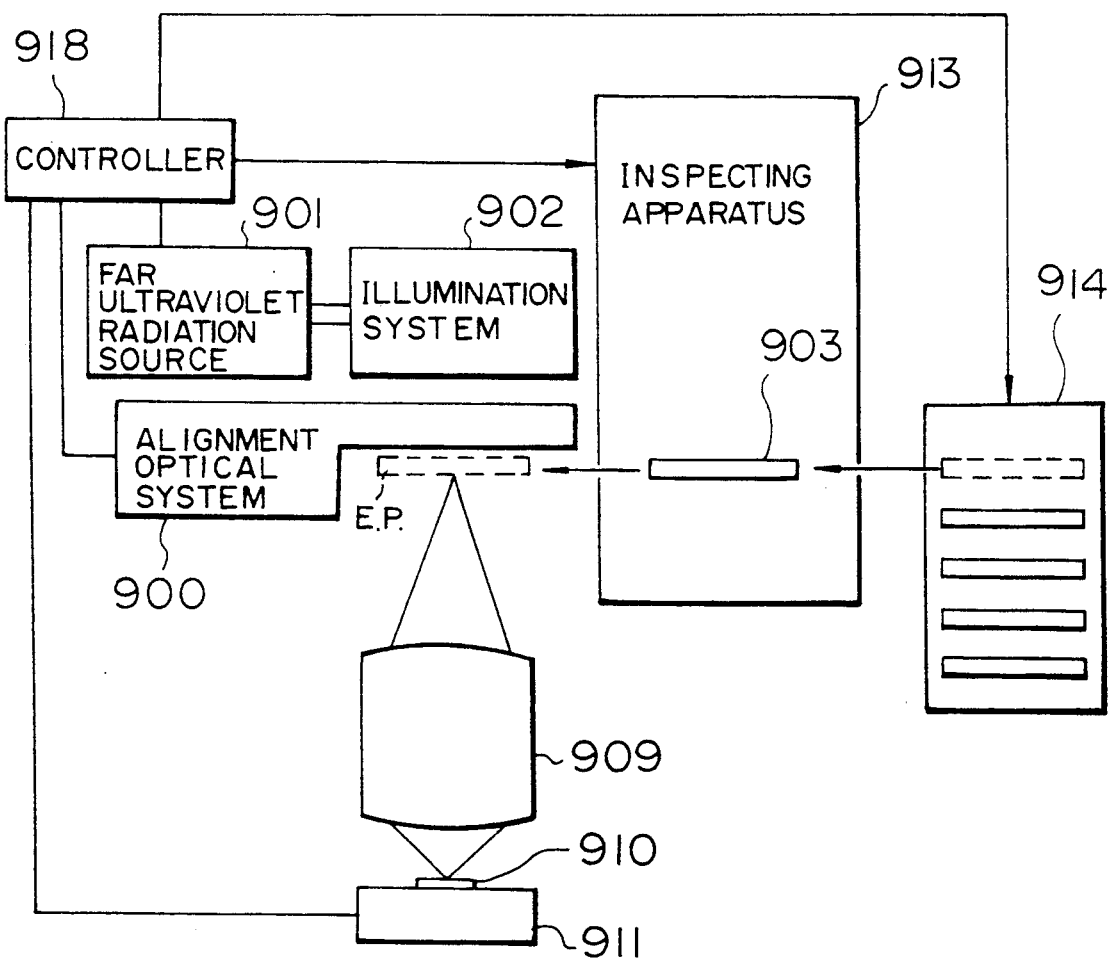
FIG. 10 is a block diagram showing the construction of an exposure system.

FIG. 10 is a diagram showing an embodiment of an exposure system for manufacturing semiconductor devices by printing the circuit patterns of masters in the form of reticles, photomasks or the like onto silicon wafers. The system generally comprises an exposure apparatus, master storing device, master inspection apparatus and controller, which are installed in a clean room.

Numeral 901 indicates a far ultraviolet radiation source such as an excimer laser, and numeral 902 indicates an illumination system unit, which has the function of illuminating masters set at a predetermined exposure position E.P. simultaneously (collectively) from above with a predetermined numerical aperture NA.

Numeral 909 indicates an ultra-high resolution lens system (or mirror system) for transferring the circuit patterns formed on the masters onto silicon wafers 910. In printing, wafers are shifted for each shot in synchronism with the step feed of the movable stage 911. The movable stage 911 has a high-precision stage structure as described with reference to the above embodiments. Numeral 900 indicates an alignment optical system for effecting positioning between the masters and the wafers prior to the exposure operation. The alignment optical system 900 has at least one microscope system for observing masters. These components form the exposure apparatus of this embodiment.

Numeral 914 indicates a master storing device, which stores a plurality of masters. Numeral 913 indicates a master inspection apparatus, which inspects each master selected and extracted from the master storing device 914 for any foreign matter thereon prior to its setting in the exposure position E.P. A controller 918 serves to perform sequence control over the entire system. It supplies operation commands to the master storing device 914 and the master inspection apparatus 913 and performs sequence control for alignment, exposure, wafer step feed, etc., which are the fundamental operations of the exposure apparatus.

The exposure process according to the system of this embodiment will now be described. First, the selected master is extracted from the master storing device 914 and set in the master inspection apparatus 913, where it is inspected for any foreign matter thereon. If there is no foreign matter, the master is set at the exposure position E.P. of the exposure apparatus. Next, a silicon wafer 910, which constitutes the object to be exposed, is set on the movable stage 911. Then, while shifting the wafer for each shot in synchronism with the step feed of the movable stage 911 by the step & repeat method, a reduced-size master pattern is projected for repeated exposure. When the first silicon wafer has been completely exposed, it is stored in the storing device and a new silicon wafer is supplied, and master pattern exposure is repeated in the same manner by the step and repeat method.

With the exposure system of this embodiment, it is possible to manufacture highly integrated semiconductor devices having very minute circuit patterns, which have conventionally been difficult to manufacture.

Figure 11:
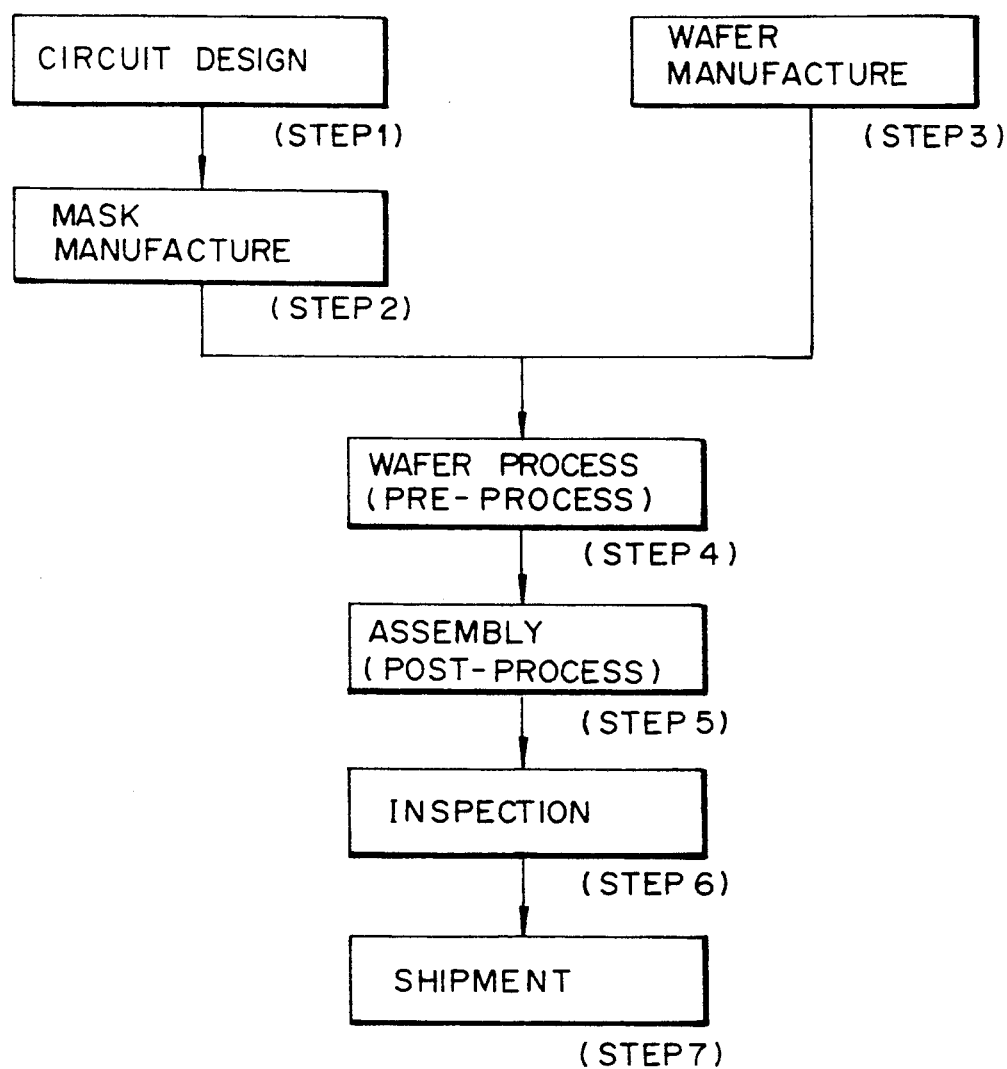
FIG. 11 is a diagram showing a flowchart for manufacturing semiconductor devices.

Next, to be described will be an embodiment of a semiconductor device manufacturing method utilizing the above-described exposure system. FIG. 11 shows a flowchart for manufacturing semiconductor devices (semiconductor chips for ICs, LSIs or the like, or liquid crystal panels, CCDs, etc.). In step 1 (circuit design), semiconductor-device circuits are designed. In step 2 (mask manufacture), masks having the designed circuit patterns are manufactured. In step 3 (wafer manufacture), wafers are manufactured by using materials such as silicon. Step 4 (wafer process) is called a "pre-process", in which the masks and wafers thus prepared are used to form actual circuits on the wafers by lithography. Step 5 (assembly) is called a "post-process", in which the wafers processed in step 4 are formed into semiconductor chips and which include an assembly process (dicing and bonding), a packaging process (chip sealing-in), etc. In step 6 (inspection), the semiconductor devices prepared in step 5 are checked for operability and durability. Then, the semiconductor devices completed through these processes are shipped (step 7).

Figure 12:
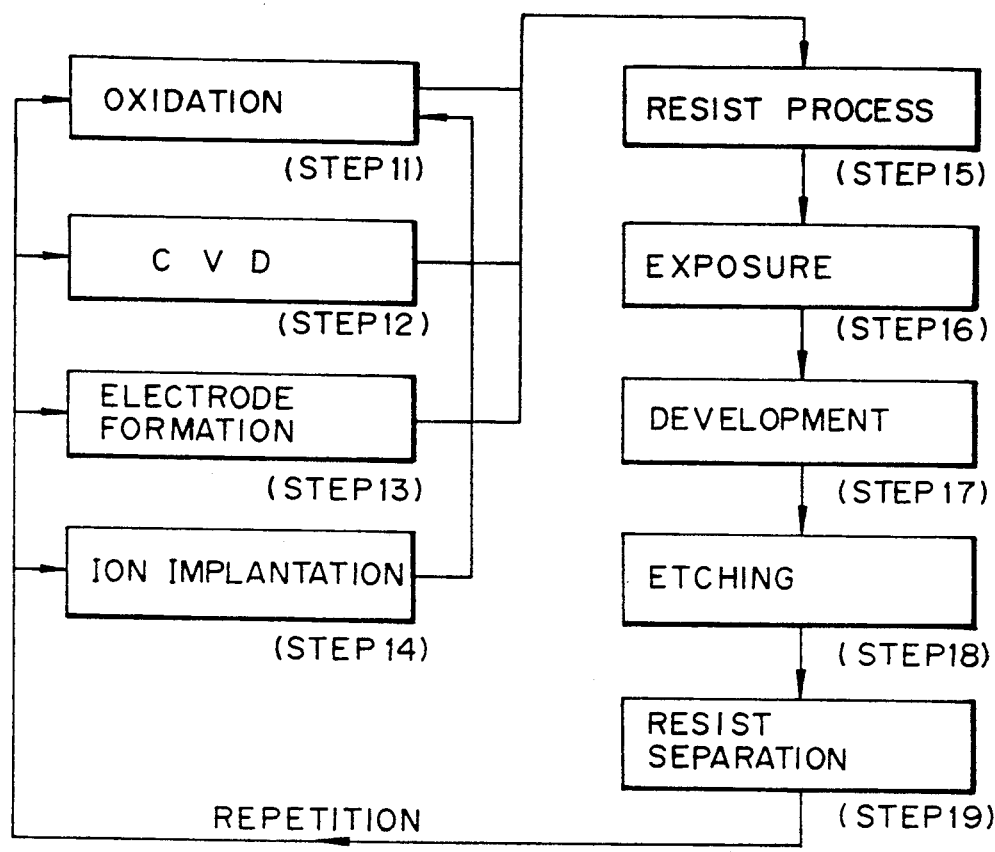
FIG. 12 is a diagram showing a wafer process flowchart.

FIG. 12 shows a detailed flowchart of the above-described wafer process. In step 11 (oxidation), the wafer surfaces are oxidized. In step 12 (CvD), an insulating film is formed on the surface of each wafer. In step 13 (electrode formation), electrodes are formed on the wafers by evaporation. In step 14 (ion implantation), ions are implanted in the wafers. In step 15 (resist process), a photosensitive material is applied to the wafers. In step 16 (exposure), the mask circuit patterns are printed and exposed on the wafers by the above-described exposure system. In step 17 (development), the exposed wafers are developed. In step 18 (etching), those wafer portions other than the developed resist images are removed. In step 19 (resist separation), the post-etching resist residue is removed. By repeating these steps, a multiple circuit pattern formation can be effected on the wafers.

With the manufacturing method of this embodiment, it is possible to manufacture highly integrated semiconductor devices having very minute circuit patterns, which have conventionally been difficult to manufacture.

The individual components shown in outline or designated by blocks in the Drawings are all well-known in the semiconductor device manufacturing arts, and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A stage device, comprising:
    first support means;
    a stationary base supported by said first support means;
    guide means provided on said stationary base;
    a movable stage supported by said stationary base and said guide means;
    first driving means for imparting thrust to said movable stage and which is provided on said stationary base;
    second driving means for imparting thrust to said movable stage and which is separate from said first driving means; and
    second support means for supporting said second driving means and which is independent of said stationary base.

2. A stage device according to claim 1, wherein said first driving means comprises first switching means for switching between transmission and non-transmission of force between said first driving means and said movable stage, and wherein said second driving means comprises second switching means for switching between transmission and non-transmission of force between said second driving means and said movable stage.

3. A stage device according to claim 1, wherein said second support means has a rigidity higher than that of said first support means at least with respect to a driving direction of said second driving means.

4. A stage device according to claim 1, further comprising control means for controlling only said second driving means to impart thrust to said movable stage for a speed control operation requiring a large thrust and for controlling only said first driving means to impart thrust to said movable stage for a position control operation not requiring a large thrust.

5. A stage device according to claim 4, wherein said control means further comprises means for controlling both first and second driving means to impart thrust to said movable stage when said movable stage starts to vibrate.

6. A stage device according to claim 1, wherein each of said guide means, first driving means, second driving means, and second support means is provided in correspondence with both X- and Y-directions, and said movable stage being moved two-dimensionally in the X- and Y-directions.

7. An exposure apparatus including a stage device, comprising:
    a radiation source for generating radiation for exposure;
    optical means for irradiating a mask with radiation emitted from said radiation source to transfer a mask pattern onto an object to be exposed; and
    a stage device for adjusting a relative positional relationship between said mask and the object to be exposed,
    said stage device comprising:
    first support means;
    a stationary base supported by first support means;
    guide means provided on said stationary base;
    a movable stage supported by said stationary base and said guide means;
    first driving means for imparting thrust to said movable stage and which is provided on said stationary base;
    second driving means for imparting thrust to said movable stage and which is separate from said first driving means; and
    second support means for supporting said second driving means and which is independent of said stationary base.

8. An exposure apparatus according to claim 7, wherein each of said guide means, first driving means, second driving means, and second support means is provided in correspondence with both X- and Y-directions, and said movable stage being movable two-dimensionally in the X- and Y-directions.

9. An exposure apparatus according to claim 8, wherein said mask pattern is a circuit pattern for a semiconductor device and wherein said object to be exposed is a wafer.

10. A stage device for use in a semiconductor device manufacturing method that includes the steps of adjusting a relative positional relationship between a mask having a circuit pattern and a wafer by means of a stage device, and irradiating the mask with radiation to transfer the circuit pattern onto the wafer through exposure, said stage device comprising:
    first support means;
    a stationary base supported by said first support means;
    guide means provided on said stationary base;
    a movable stage supported by said stationary base and said guide means;

first driving means for imparting thrust to said movable stage and which is provided on said stationary base;

second driving means for imparting thrust to said movable stage and which is separate from said first driving means; and second support means for supporting said second driving means and which is independent of said stationary base.

11. A stage device for used in a semiconductor device manufacturing method according to claim 10, wherein said adjusting and irradiating steps are repeated to transfer the circuit pattern onto each of a plurality of wafer regions.

12. A semiconductor device manufactured by a manufacturing method that includes the steps of adjusting a relative positional relationship between a mask having a circuit pattern and a wafer by means of a movable stage device, and irradiating the mask with radiation to transfer the circuit pattern onto the wafer through exposure, wherein the adjusting step further comprises the steps of:

supporting a stationary base with first support means;
providing guide means on the stationary base;
supporting the movable stage with the stationary base and the guide means;
driving the movable stage with first driving means which imparts thrust to the movable stage and which is provided on the stationary base;
driving the movable stage with second driving means which imparts thrust to the movable stage and which is separate from the first driving means; and
supporting the second driving means with second support means which is independent of the stationary base.

13. A semiconductor device according to claim 12, wherein said adjusting and irradiating steps are repeated to transfer the circuit pattern onto each of a plurality of wafer regions.

14. A semiconductor device manufacturing method that includes the steps of adjusting a relative positional relationship between a mask having a circuit pattern and a wafer by means of a movable stage, and irradiating the mask with radiation to transfer the circuit pattern onto the wafer through exposure, said method comprising the steps of:

supporting a stationary base with a first support means;
providing guide means on the stationary base;
supporting the movable stage with the stationary base and the guide means;
driving the movable stage with first driving means which imparts thrust to the movable stage and which is provided on the stationary base;
driving the movable stage with second driving means which imparts thrust to the movable stage and which is separate from the first driving means; and
supporting the second driving means with second support means which is independent of said stationary base.

15. A semiconductor device manufacturing method according to claim 14, wherein said adjusting and irradiating steps are repeated to transfer the circuit pattern onto each of a plurality of wafer regions.

* * * * *

UNITED STATES PATENT AND TRADEMARK OFFICE
CERTIFICATE OF CORRECTION

PATENT NO. : 5,260,580
DATED : November 9, 1993
INVENTOR(S) : HIROHITO ITOH, ET AL.

It is certified that error appears in the above-indentified patent and that said Letters Patent is hereby corrected as shown below:

ON THE COVER PAGE

IN THE ABSTRACT:

Line 6, "plate" should read --plate.--.

COLUMN 7:

Line 11, "$84_1 \sim 844$," should read --$84_1 \sim 84_4$,--.

COLUMN 11:

Line 1, "$4_{x1}$ and $4_{x1}$" should read --$4_{x1}$ and $4_{x2}$--; and
Line 23, "X ray" should read --X-ray--.

UNITED STATES PATENT AND TRADEMARK OFFICE
CERTIFICATE OF CORRECTION

PATENT NO. : 5,260,580
DATED : November 9, 1993
INVENTOR(S) : HIROHITO ITOH, ET AL.

It is certified that error appears in the above-indentified patent and that said Letters Patent is hereby corrected as shown below:

<u>COLUMN 13</u>:

Line 3, "(CvD)," should read --(CVD),--.

<u>COLUMN 15</u>:

Line 10, "used" should read --use--.

Signed and Sealed this

Fifth Day of July, 1994

*Attest:*

BRUCE LEHMAN

*Attesting Officer*      *Commissioner of Patents and Trademarks*